(12) United States Patent
Tsuji

(10) Patent No.: US 6,599,773 B2
(45) Date of Patent: Jul. 29, 2003

(54) ELECTRONIC PART AND METHOD OF FABRICATING THEREOF

(75) Inventor: Kazuyoshi Tsuji, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/117,037

(22) Filed: Apr. 8, 2002

(65) Prior Publication Data

US 2002/0113298 A1 Aug. 22, 2002

Related U.S. Application Data

(62) Division of application No. 09/640,777, filed on Aug. 18, 2000, now Pat. No. 6,410,980.

(30) Foreign Application Priority Data

Aug. 20, 1999 (JP) .......................................... 11-233459

(51) Int. Cl.[7] .............................................. H01L 21/44
(52) U.S. Cl. ...................................... 438/106; 438/124
(58) Field of Search ................................ 438/106, 123, 438/124, 111, 112; 257/666

(56) References Cited

FOREIGN PATENT DOCUMENTS

| JP | 58-54659 | 3/1983 |
|----|----------|--------|
| JP | 58-197868 | 11/1983 |
| JP | 62-165348 | 7/1987 |
| JP | 63-164251 | 7/1988 |
| JP | 1-217952 | 8/1989 |
| JP | 11-54686 | 2/1999 |
| JP | 11-87564 | 3/1999 |

*Primary Examiner*—Roy Potter
(74) *Attorney, Agent, or Firm*—Morgan, Lewis & Bockius LLP

(57) ABSTRACT

A lead frame is fabricated by a stamping system, and the lead frame 1 having a predetermined pattern is fabricated by blanking a lead frame material by a progressive stamping die apparatus while the lead frame material is being consecutively transferred. A pressing force is applied to burrs occurring during the fabrication of the lead frame 1 so as to squeeze the burrs, thereby forming coined portions 6 and 7. Next, a coined groove 8 is formed horizontally on the surface of the lead frame 1 at a position slightly above a resin liquid level 4. Resin climbing 5 in which the resin rises from the liquid level due to a capillary phenomenon is stopped at the position of the coined groove 8 thus formed, thereby allowing soldering of the lead frame 1 to be effected without a hindrance.

7 Claims, 6 Drawing Sheets

ELECTRONIC PART AND METHOD OF FABRICATING THEREOF

This is a divisional application of application Ser. No. 09/640,777, filed on Aug. 18, 2000, now U.S. Pat. No. 6,410,980, the disclosure of which is incorporated by reference in its entirety herein.

BACKGROUND OF THE INVENTION

1. Field of the Invention

The present invention relates to an electronic part and a method of fabricating thereof, in which the rise of a resin due to a capillary phenomenon is suppressed with respect to lead wires when a device connected to the lead wires is molded by a fluid resin thereon.

2. Description of the Related Art

In a light emitting diode (LED) display using a lead frame connected to an LED device, a stamping system is known as one example of the method of fabricating the lead frame. This system employs a method of fabricating a lead frame by using a die, wherein a lead frame having a predetermined pattern is fabricated by blanking a lead frame material by a progressive stamping die apparatus while the lead frame material is being consecutively transferred.

Thus, in the stamping system, since the lead frame material such as 42 alloy, SPCC, while being consecutively transferred, is blanked, burrs occur in front of the blanking direction. FIG. 13 is a schematic perspective view illustrating a state in which burrs have occurred in a lead frame which is used in an LED display. In FIG. 13, if a lead frame 1 is subjected to blanking in the direction of arrow X and in the direction of arrow Y, burrs 2 and 3 occur on the front side of the lead frame including leads 1 along the blanking direction.

Next, in a case where the LED device connected to the lead 1 of the lead frame is subjected to encapsulation by resin molding, the lead 1 of the lead frame on which the LED Chip is mounted is immersed in a liquefied (liquid state) epoxy resin, or a resin is applied to the LED Element mounted on the lead 1 of the lead frame by injection mold method or transfer mold method and hardened. At this juncture, the so-called resin climbing 5 occurs in which the resin rises from a resin liquid level designated by reference numeral 4 in FIG. 13, i.e., a surface of contact between the lead 1 of the lead frame and the fluid resin, up to the height H1 along the surface of the lead frame 1 owing to the capillary phenomenon.

When a resin coating is formed on a soldering effective portion of the lead frame 1 by the resin climbing 5, there are cases where when the lead 1 and outer leads or the like are electrically connected by soldering, faulty joining can occur, with the result that the LED device fails to operate with predetermined characteristics.

FIG. 14 is a perspective view illustrating an example in which a means is adopted for suppressing such resin climbing 5. In the example shown in FIG. 14, a pressing force is applied to the burrs 2 and 3, which occur in the lead 1 as shown in FIG. 13, from diagonal directions Z and W so as to squeeze the burrs 2 and 3, thereby forming coined portions 6 and 7. By providing such coining processing, the height of the resin climbing 5 of the resin is reduced to the height H2.

By providing coining processing for the burrs occurring in the lead frame as shown in FIG. 14, the height of the resin climbing 5 can be reduced. However, variations occur in the formation of the coined portions 6 and 7 at the time of coining processing. Further, since gaps Ga and Gb occur between each of the coined portions 6 and 7 and the flat surface portion, there has been a problem in that the rise of the resin due to the capillary phenomenon cannot be suppressed sufficiently.

SUMMARY OF THE INVENTION

The invention has been devised in view of the above-described problem, and its object is to provide an electronic part in which the resin climbing with respect to lead is suppressed when a device connected to the lead is encapsulated by a fluid resin thereon, thereby preventing the occurrence of faulty soldering.

In the invention, the above object of the invention can be attained by an electronic part in which a device is connected to a lead, and the device is encapsulated by a fluid resin thereon, characterized in that a groove for suppressing the rise of the resin is provided in the lead at a predetermined heightwise position from a surface of contact with the fluid resin. Namely the groove is located at near a boundary between a region of the lead to be mold and another region. In detail the groove is formed at a position apart from the boundary by a constant distance. According to this invention, by providing a groove for suppressing the rise of the resin in the lead at a predetermined heightwise position from a surface of contact with the fluid resin, resin climbing by a capillary phenomenon is suppressed to be able to prevent a solder-bonding from being caused by resin climbing.

In accordance with the above-described characteristic feature of the above structure of the invention, a groove for suppressing the rise of the resin is provided in the lead wire at a predetermined heightwise position from a surface of contact with the fluid resin when a device connected to the lead wire is encapsulated by casting a fluid resin thereon. For this reason, since the resin does not adhere to a portion of the lead wire located above the position of the groove, it is possible to prevent the occurrence of faulty soldering of an outer lead.

Preferably, the groove is formed to be perpendicular to the longitudinal(length) direction of the lead. In accordance with the above-described characteristic feature of the above structure of the invention, according to the groove perpendicular to the lead, resin climbing can be completely prevented to suppress a resin climbing confirmly.

Preferably, the groove is formed by stamping method so that the groove is formed on a face comprises a face facing to blanked surface.

Leads formed by stamping method are easy to generate burrs, and even if coining treatment for preventing burrs from being generated is conducted, resin climbing along a clearance easy to be generated.

In accordance with the above-described characteristic feature of the above structure of the invention, resin climbing can be completely prevented to suppress a resin climbing confirmly.

Preferably, the groove is formed by stamping method so that the groove is formed on a face comprises a face on which burrs are formed.

Preferably, the groove is formed on a face on which burrs are formed and the neighbor faces.

In accordance with the above-described characteristic feature of the above structure of the invention, resin climbing can be completely prevented to suppress a resin climbing confirmly.

Preferably, in the electronic part according to the present invention, a plurality of grooves are formed as the groove.

Preferably, in the electronic part according to the present invention, a projection is formed in such a manner as to be contiguous to the groove.

In accordance with the above-described characteristic feature of the invention according to claim 2, since a plurality of grooves are formed, even if the resin has leaked from the groove formed closest to the contact and has risen, the rise of the resin can be suppressed reliably by the ensuing grooves.

In accordance with the above-described characteristic feature of the invention, a projection is formed in such a manner as to be contiguous to the groove. For this reason, since both the groove and the projection serve as barriers for the rising resin, the resin climbing from the contact surface can be suppressed reliably by their synergistic effect.

According to this invention, the method comprises the steps of: preparing a lead frame having leads on which grooves are formed at a predetermined heightwise position from a region to be molded; mounting a chip on the lead frame; and molding the chip with a part of the lead so that the grooves are located outside of the molded region.

Preferable the step of preparing the lead frame comprises a step of forming at least outer leads located outside of the molding resin by stamping method.

In the case that at least outer leads are formed by stamping method, there is a problem that burrs are easy to be generated on the outer lead and resin climbing is easy to be caused. But according to the present invention, resin climbing can be prevented effectively.

Preferably the grooves are formed simultaneously on the step of forming lead frame by stamping method.

According to the method, reliable electronic parts can be obtained easily without increasing the process steps.

Preferably the step of molding comprises the steps of immersing the leads on which the chip is mounted and hardening the resin.

Preferably the step of molding comprises the steps of supplying a fluid resin into a recess of a case; and dipping the lead frame on which the chip is mounted into the a fluid resin.

According to the above method, resin climbing is suppressed to be able to prevent a solder-bonding from being caused by resin climbing.

Preferably the step of molding comprises the steps of: potting a resin onto the lead frame on which the chip is mounted; and hardening the resin.

Preferably the step of molding comprises the step of molding the lead frame on which the chip is mounted by transfer mold method.

According to the method, since melted resin pushed out from the die by pressure from inside of the die is stopped at the grooves, reliable electronic parts without burrs can be obtained. Even if resin burrs are generated, resin is embedded only within the grooves so as not to progress exceeding to the groves. Therefore only reliable electronic parts can be obtained without obstacle in appearance.

DESCRIPTION OF THE PREFERRED EMBODIMENTS

Figure 1A:
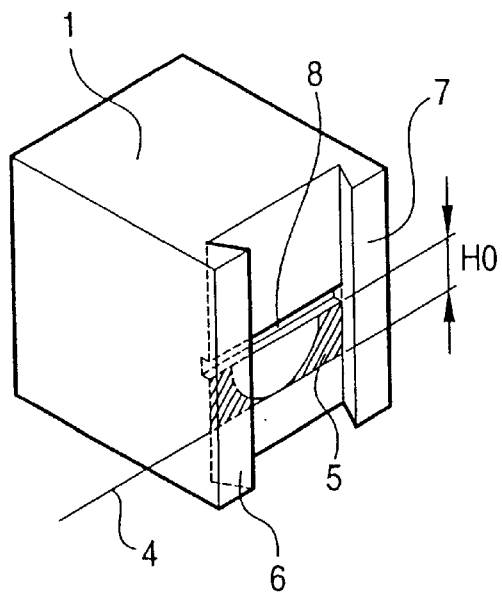
FIGS. 1A and 1B are a perspective view illustrating a lead frame used in an LED display in accordance with an embodiment of the invention and a view for explaining the lead frame.
Figure 1B:
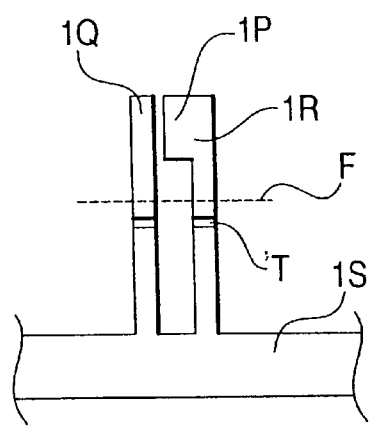

Hereafter, a description will be given of the embodiments of the invention with reference to the drawings. FIGS. 1A and 1B are a schematic perspective view illustrating a lead frame connected to an LED device in an LED display in accordance with an embodiment of the invention and a planar view of the lead frame. As described with reference to FIG. 13, this lead 1 of the lead frame is fabricated by the stamping system, and a predetermined pattern is formed by blanking a lead frame material by a progressive stamping die apparatus while the lead frame material is being consecutively transferred.

As shown in FIG. 1B, one unit of the lead frame consists of a first lead 1Q, on an end of which, pad 1P for mounting LED chip; and a second lead 1R located near the first lead.

As described above, a pressing force is applied to the burrs occurring during the fabrication of the lead frame so as to squeeze the burrs, thereby forming coined portions 6 and 7. In the coining processing at this time, in addition to applying the pressing force to the burrs from a diagonal direction, a pressing force may be applied to the burrs from a perpendicular direction.

Next, a coined groove (a score) 8 is formed horizontally on the surface of the lead frame 1 at a position slightly above a resin liquid level 4. The coined groove 8 thus formed acts as a physical barrier with respect to the resin which rises from the liquid level 4 owing to the capillary phenomenon, and suppresses the resin from rising above this groove 8. In FIG. 1B, F represents an end of molded portion, and T represents a groove formed in each of the first 1Q and the second lead 1R.

Figure 13:
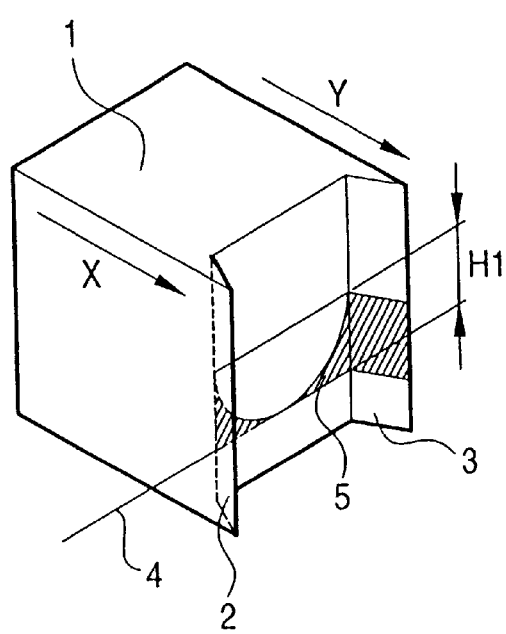
FIG. 13 is a perspective view illustrating a lead frame of a conventional LED display.
Figure 14:
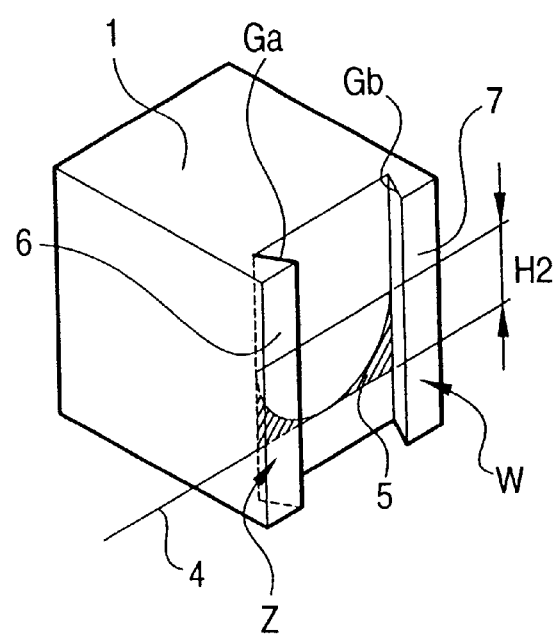
FIG. 14 is a perspective view illustrating a lead frame of another conventional LED display.

For this reason, the height of resin climbing 5 from the liquid level is lowered to the height H0, i.e., the height from the liquid level to the coined groove 8. This height H0 is lower than the heights H1 and H2 respectively shown in FIGS. 13 and 14 illustrating the conventional examples. By appropriately selecting the height from the liquid level where the coined groove 8 is formed, an arrangement can be provided in which even if the resin adheres to the lead frame 1, soldering to outer lead is not affected.

The above-described coined groove 8 can be formed simultaneously by using a stepped die when the lead frame is fabricated by the stamping system except for the above method of forming the groove after forming the lead frame. In addition, the coined groove 8 can be formed by using a tool when the lead frame is cut to a predetermined size. Furthermore, the groove can be formed at a predetermined position on the lead frame by using a cutting tool.

In addition, the depth of the groove 8 is formed to such an extent that the mechanical strength of the lead frame 1 does not decline, e.g., to about one-twentieth of the thickness of the lead frame 1. As a specific example of the depth at this time, the groove is formed with a depth of 100 μm or thereabouts.

Figure 2:
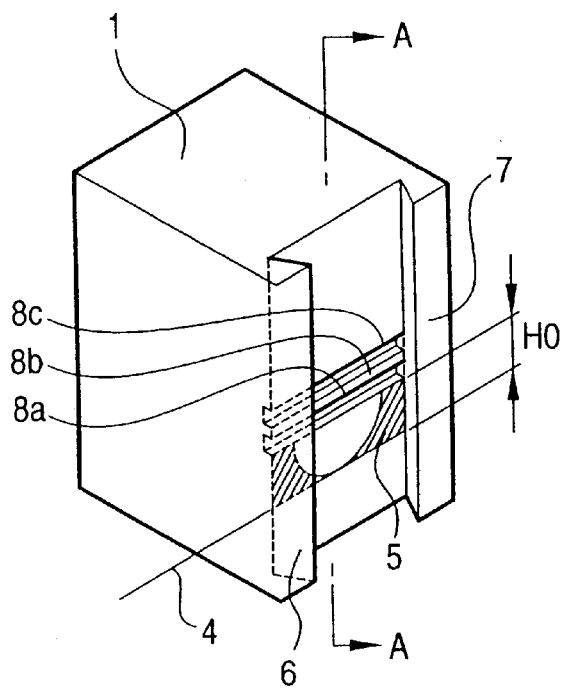
FIG. 2 is a perspective view illustrating the lead frame used in the LED display in accordance with a second embodiment of the invention.

FIG. 2 is a schematic perspective view of the lead frame used in the LED display in accordance with a second embodiment of the invention. In the example shown in FIG. 2, a plurality of grooves 8a to 8c are formed. By forming the plurality of grooves 8a to 8c in this manner, since the grooves 8b and 8c act to back up the groove 8a, it is possible to effectively suppress the resin climbing 5 from the resin liquid level 4. Namely, even if the resin has leaked from the groove 8a formed closest to the liquid level and has risen, the rise of the resin can be suppressed reliably by the ensuing grooves 8b and 8c.

Figure 3:
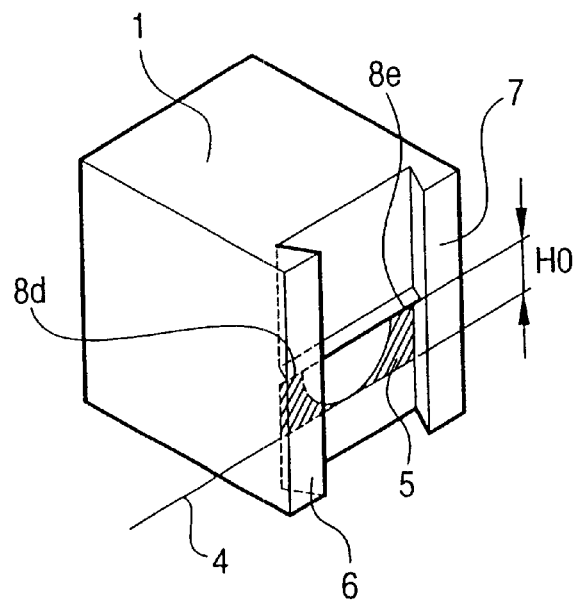
FIG. 3 is a perspective view illustrating the lead frame used in the LED display in accordance with a third embodiment of the invention.

FIG. 3 is a schematic perspective view of the lead frame used in the LED display in accordance with a third embodiment of the invention. In the example shown in FIG. 3, grooves 8d and 8e which traverse only the coined portions 6 and 7 are formed. As explained with reference to FIG. 14, it is conceivable that the presence of gaps Ga and Gb formed between each of the coined portions 6 and 7 and the flat surface portion is the cause of the occurrence of the resin climbing from the liquid level due to the capillary phenomenon, even if the grooves are formed only at the coined portions 6 and 7, it is possible to suppress the resin climbing 5 from the resin liquid level 4.

Accordingly, as for the grooves for suppressing the rise of the resin in the invention, in addition to the groove formed linearly over the entire widthwise length of the lead frame as shown in FIG. 1, an arrangement is also included in which the formation of a groove in a central portion in the widthwise direction of the lead frame is omitted and grooves are formed only at opposite ends.

In the case where the grooves 8d and 8e are formed only at the coined portions 6 and 7, there is an advantage in that an unnecessary portion of the lead frame 1 need not be damaged as compared with the case where the groove 8 is formed over the entire widthwise direction of the lead frame 1 as shown in FIG. 1.

Figure 4:
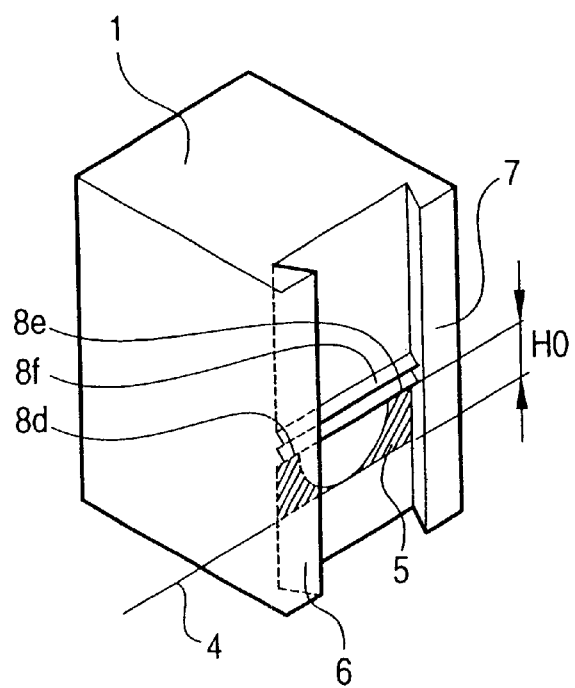
FIG. 4 is a perspective view illustrating the lead frame used in the LED display in accordance with a fourth embodiment of the invention.

FIG. 4 is a schematic perspective view of the lead frame used in the LED display in accordance with a fourth embodiment of the invention. In the example shown in FIG. 4, as a groove for backing up the grooves 8d and 8e traversing only the coined portions 6 and 7, a groove 8f is formed over the entire widthwise direction of the lead frame 1. In this case as well, since the grooves 8d and 8e and the groove 8f serve as a double barrier, it is possible to reliably suppress the resin climbing 5 from the resin liquid level 4 in the same way as the example of FIG. 2.

Figure 5:
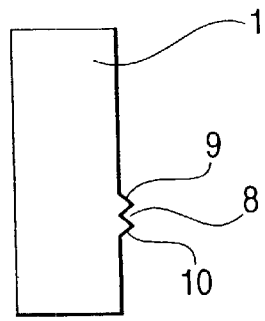
FIG. 5 is a schematic vertical cross-sectional view taken in the direction of arrows A—A in FIG. 2.

FIG. 5 is a schematic vertical cross-sectional view taken in the direction of arrows A—A in FIG. 1. In a case where the pressing force of a cutting tool or the like is large when the groove 8 is formed in the lead frame 1 by the cutting tool or the like, projections 9 and 10 are formed on both sides of the groove 8, as shown in FIG. 5. Namely, when a recessed portion is formed by the groove 8, the projections 9 and 10 are formed on both sides thereof due to plastic deformation.

In the case where the projections 9 and 10 are thus formed, both the groove 8 and the projections 9 and 10 which are formed on both sides thereof in a contiguous manner serve as barriers for the resin, the resin climbing 5 from the resin liquid level 4 can be suppressed reliably by their synergistic effect.

Figure 6A:
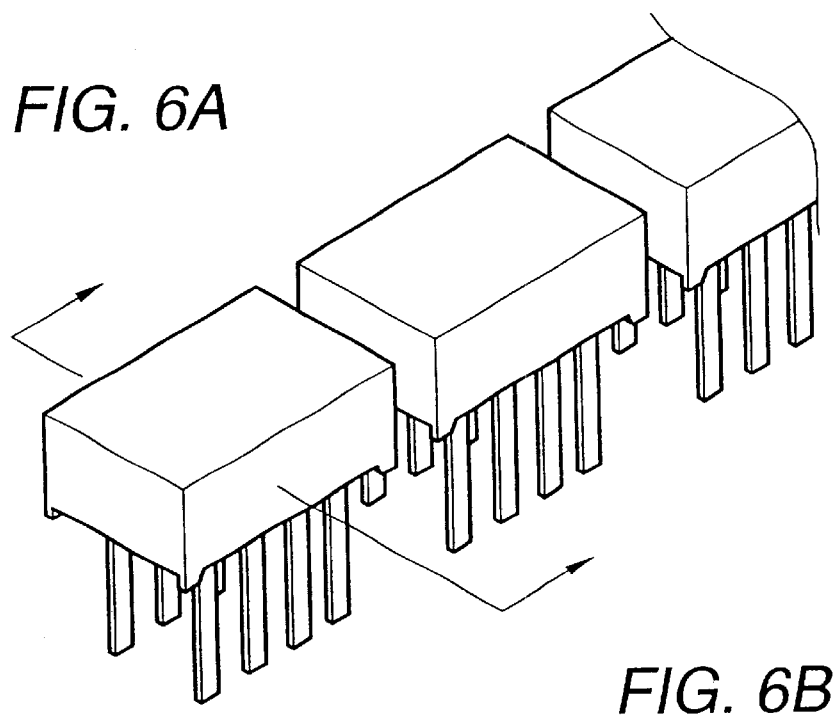
FIGS. 6A and 6B are a perspective view and a cross-sectional view of the LED display of a fifth embodiment of the invention.
Figure 6B:
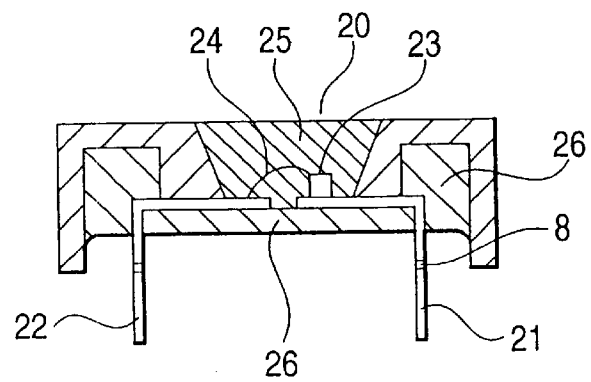

FIG. 6 is a cross-sectional view of an LED display for displaying numbers by, for example, eight segments including a decimal point as a fifth embodiment. In FIG. 6, an LED display 20 has leads 21 and 22, an LED device 23 is mounted on the lead 21 and is electrically connected thereto, while the LED device 23 is connected to the lead 22 by a bonding wire 24.

Reference numeral 25 denotes a translucent resin molded portion, and numeral 26 denotes an opaque resin molded portion which is formed by casting an opaque resin into a mold. Numeral 27 denotes a substrate. When the liquid level of the opaque resin is set to a position 26a, if the grooves 8 for suppressing the resin climbing are formed in advance on the lead frames 21 and 22 at the illustrated positions, the resin does not adhere to the sides below the grooves 8 in the drawing as described above. For this reason, it is possible to prevent the occurrence of faulty electrical connection when outer lead and the lead frames 21 and 22 are soldered.

Figure 7:
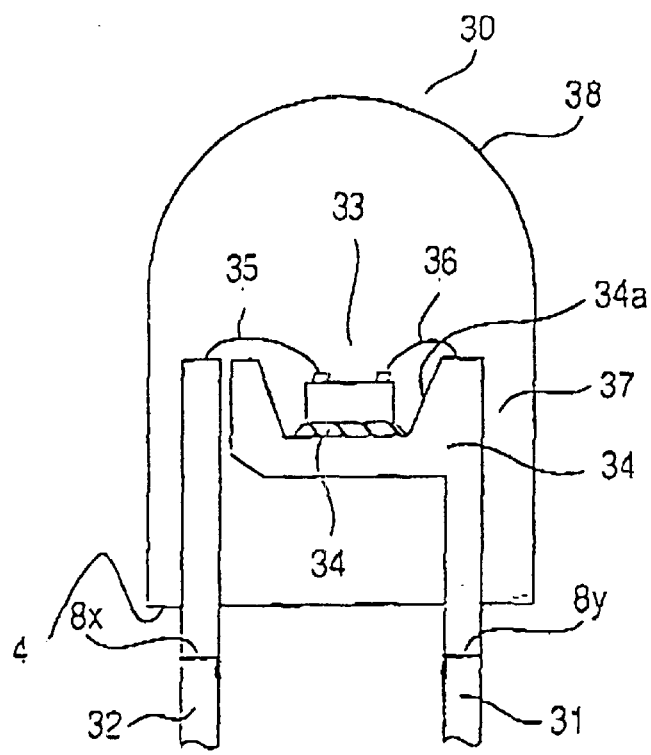
FIG. 7 is a vertical cross-sectional view of an LED lamp of a sixth embodiment of the invention.

In the above-described examples, a description has been given of the example of forming a groove or grooves for preventing the rise of the resin to a predetermined position on the lead frame due to the capillary phenomenon in the case of an LED device. This invention is also applicable to electronic parts other than the LED display. FIG. 7 is a vertical cross-sectional view illustrating an example in which a sixth embodiment of the invention is applied to an LED lamp.

In FIG. 7, an LED lamp 30 is provided with a pair of lead terminals 31 and 32, and a pad 34 formed of an iron material is formed at a tip of one lead terminal 31 thereof. As a light emitting element 33 of this LED lamp 30, one which emits blue light by using a nitrogen compound such as GaN as a light emitting layer is used.

A recessed portion 34a is formed in a substantially central portion of the pad 34. As for this recessed portion 34a, its outside diameter is selected to be larger than the outside diameter of the light emitting element 33, and its depth is set to be larger than the thickness of the light emitting element 33, thereby accommodating the light emitting element 33 in the recessed portion 34a. The light emitting element 33 is die-bonded to the recessed portion 34a of the pad 34 of the lead frame by using a bonding material 39 such as silver paste or transparent epoxy resin. Further, the light emitting element 33 is wire-bonded to a tip of the pad 34 of the lead frame by a metal wire 35, and is wire-bonded to the lead terminal 32 by a metal wire 36.

Reference numeral 37 denotes a transparent or semitransparent synthetic resin molded portion for covering the light emitting element 33, which has been die-bonded to the recessed portion 34a of the pad 34 by the bonding material 39 such as silver paste or transparent epoxy resin and has been wire-bonded to the tip of the pad 34 and the lead terminal 32 by the metal wires 35 and 36, respectively, and for packaging the lead terminals 31 and 32. A substantially semispherical lens 38 is formed as a tip portion of the molded portion 37. The LED lamp 30 is thus formed in a cylindrical shape with a substantially semispherical tip portion, i.e., in a dome shape.

Grooves 8x and 8y are respectively formed at predetermined positions on the pair of lead terminals 31 and 32. In this case as well, the resin climbing from the resin liquid level 4 is suppressed at the positions of the grooves 8x and 8y, making it possible to ensure that a hindrance is not caused to the soldering of the pair of lead terminals 31 and 32 and outer leads.

In addition, the invention can be applied to electronic parts in general in which, as in the case of a transformer or a coil, a device connected to lead is sealed by a fluid resin thereon, and the lead are connected to external lead such as printed circuit by soldering.

It should be noted that although, in the above-described examples, the lead wires connected to a device are immersed in a fluid resin so as to encapsulate the device, the invention is also applicable to electronic parts which are encapsulated by transfer molding. In the case where encapsulation is effected by transfer molding, by using the known arrangement of resin encapsulation in which cavities are continuously formed in a transfer pot, a thermosetting resin accommodated in the transfer pot is pressurized so as to be set in a molten state, and is transferred to the cavities, in order to encapsulate electronic components of predetermined shapes disposed in the cavities.

In this case, the grooves for preventing the resin climbing are formed in the lead wires at predetermined heightwise positions from the contact surface of the resin in the molten state. Thus, the invention can be generally applied to electronic parts in which devices are encapsulated by a fluid resin in a liquid or molten state.

Figure 8:
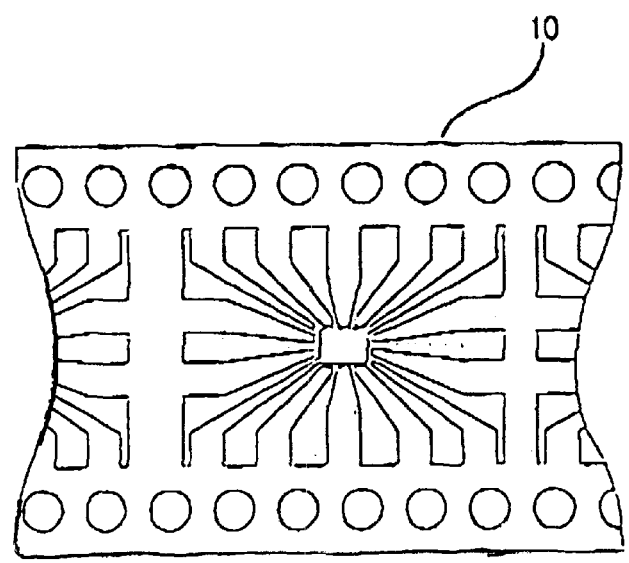
FIG. 8 is a view representing a lead frame of a seventh embodiment of the invention.
Figure 9:
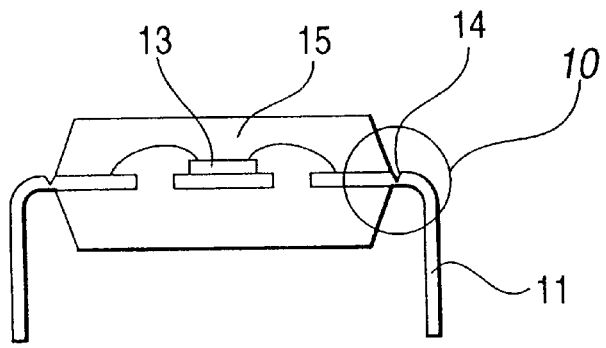
FIG. 9 is a view representing an IC using a lead frame of the seventh embodiment of the invention.
Figure 10A:
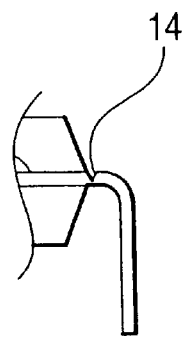
FIGS. 10A and 10B are views partially representing a main part of the lead frame of the seventh embodiment of the invention.
Figure 10B:
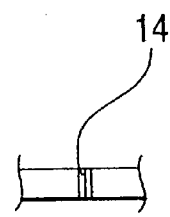

FIGS. 8 to 10 show an IC formed by using a seventh embodiments of the invention. This IC is formed by using a lead frame 10 having outer lead, in which a groove 14 is formed as shown in FIG. 8 and mounting an IC chip 13 and then molding them. The groove 14 is formed near boundary of the molded region. This groove is formed by stamping method so that the groove is formed on a face comprises a face facing to blanked surface and being easy to generate burrs.

In accordance with the above-described characteristic feature of the above structure of the invention, resin climbing can be prevented to suppress a resin climbing. Even if a small amount of resin climbing is caused, the resin climbing can be stopped by the grooves and resin burrs can be completely prevented.

Figure 11A:
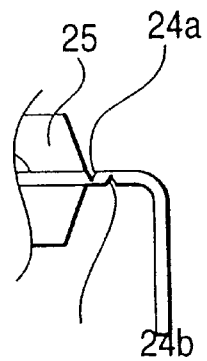
FIGS. 11A to 11C are views partially representing a main part of the IC using a lead frame of the eighth embodiment of the invention.
Figure 11B:
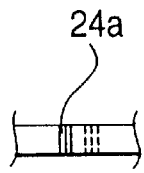
Figure 11C:
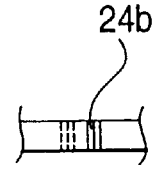

Further an eighth embodiment of the present invention is characterized in that grooves 14 are formed on both sides of the outer lead near molding surface, as shown in FIGS. 11A to 11C, representing a magnified view of main portion of the lead of the electronic part of the invention, upper view and lower view.

In accordance with the above-described characteristic feature of the above structure of the invention, resin climbing can be prevented to suppress a resin climbing. Even if a small amount of resin climbing is caused, the resin climbing can be stopped by the grooves and resin burrs can be completely prevented.

Further this invention is applicable effectively to a method of molding by immersing a lead on which a chip is mounted and pulling up it.

Figure 12:
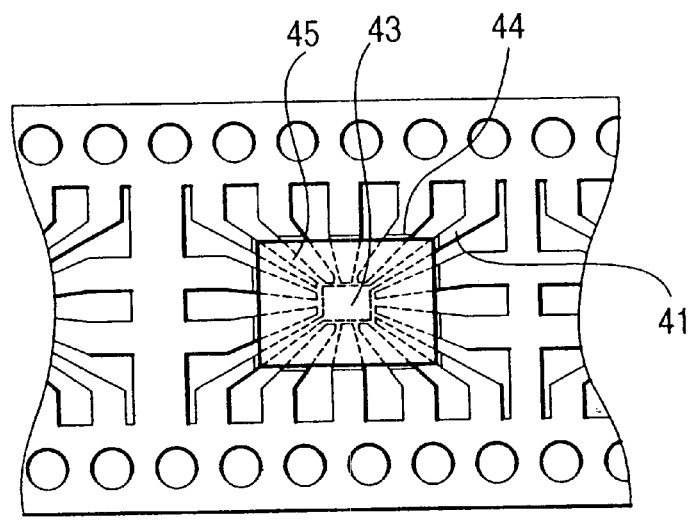
FIG. 12 is a view representing the IC with the lead frame of the eighth embodiment of the invention.

Further as a ninth embodiment of the present invention, as shown in FIG. 12, the present invention is applicable to a method by mounting a chip 43 as being face down on an end of the lead 41 having grooves 44; potting a resin 45 so as to cover the lead on which the chip 43 is mounted; and hardening the resin 45.

According to the ninth embodiment, by the presence of the grooves 44 formed near a region to be molded of the lead, resin climbing is stopped, and a good lead surface without resin climbing can be obtained.

In accordance with the above-described characteristic feature of the above structure of the invention, resin climbing can be prevented to suppress a resin climbing. Even if a small amount of resin climbing is caused, the resin climbing can be stopped by the grooves and resin burrs can be completely prevented.

Further the present invention I applicable to the electronic part formed by the following steps. The step of molding comprises the steps of supplying a fluid resin into a recess of a case; and dipping the lead frame on which the chip is mounted into the fluid resin.

According to the above method, resin climbing is suppressed to be able to prevent a solder-bonding from being caused by resin climbing.

In the above embodiments, as a resin epoxy resin is used but not limiting to epoxy resin, another thermosetting resin can be used.

As described above, in accordance with the above-described characteristic feature of the invention, a groove for suppressing the rise of the resin is provided in the lead at a predetermined heightwise position from a surface of contact with the fluid resin when a device connected to the lead wire is encapsulated by casting a fluid resin thereon. For this reason, since the resin does not adhere to a portion of the lead wire located above the position of the groove, it is possible to prevent the occurrence of faulty soldering of an external lead wire.

In accordance with the above-described characteristic feature of the invention, since a plurality of grooves are formed, even if the resin has leaked from the groove formed closest to the contact and has risen, the rise of the resin can be suppressed reliably by the ensuing grooves.

In accordance with the above-described characteristic feature of the invention, a projection is formed in such a manner as to be contiguous to the groove. For this reason, since both the groove and the projection serve as barriers for the rising resin, the resin climbing from the contact surface can be suppressed reliably by their synergistic effect.

What is claimed is:

1. A method of fabricating an electronic part, comprising the steps of:

preparing a lead frame having leads on which grooves are formed at a position apart from a region to be molded by a constant value;

mounting a chip on the lead frame; and molding the chip with a part of the lead so that the grooves are located outside of the molded region.

2. A method of fabricating an electronic part according to claim 1, wherein the step of preparing the lead frame comprises a step of forming at least outer leads located outside of the molding resin by stamping method.

3. A method of fabricating an electronic part according to claim 1, wherein the grooves are formed simultaneously on the step of forming lead frame by stamping method.

4. A method of fabricating an electronic part according to claim 1, wherein the step of molding comprises the steps of immersing the leads on which the chip is mounted and hardening the resin.

5. A method of fabricating an electronic part according to claim 1, wherein the step of molding comprises the steps of supplying a fluid resin into a recess of a case; and dipping the lead frame on which the chip is mounted into the a fluid resin.

6. A method of fabricating an electronic part according to claim 1, wherein the step of molding comprises the steps of:

potting a resin onto the lead frame on which the chip is mounted; and hardening the resin.

7. A method of fabricating an electronic part according to claim 1, wherein the step of molding comprises the step of molding the lead frame on which the chip is mounted by transfer mold method.

* * * * *